United States Patent
Yonezawa et al.

(12)

(10) Patent No.: US 6,239,218 B1
(45) Date of Patent: May 29, 2001

(54) HYDROGENATED BLOCK COPOLYMER AND COMPOSITION OF THE SAME

(75) Inventors: Jun Yonezawa; Kiyoo Kato; Eiji Sasaya; Takashi Sato, all of Kanagawa (JP)

(73) Assignee: Asahi Kasei Kogyo Kabushiki Kaisha, Osaka (JP)

( * ) Notice: Subject to any disclaimer, the term of this patent is extended or adjusted under 35 U.S.C. 154(b) by 0 days.

(21) Appl. No.: 09/057,404

(22) Filed: Apr. 9, 1998

(30) Foreign Application Priority Data

Apr. 9, 1997 (JP) .................................... 9-090981
Dec. 17, 1997 (JP) .................................... 9-348010

(51) Int. Cl.[7] .................................... C08L 53/02
(52) U.S. Cl. .......................... 525/98; 525/250; 525/314; 525/315; 525/316
(58) Field of Search .............................. 525/98, 314, 250, 525/315, 316

(56) References Cited

U.S. PATENT DOCUMENTS

| | | | |
|---|---|---|---|
| 3,670,054 | * | 6/1972 | De La Mare et al. . |
| 4,168,286 | | 9/1979 | Moczygemba . |
| 4,673,714 | * | 6/1987 | Kishimoto et al. .................. 525/314 |
| 5,352,744 | * | 10/1994 | Bates et al. .......................... 525/339 |
| 5,549,964 | * | 8/1996 | Shoji et al. .......................... 428/224 |
| 5,589,542 | * | 12/1996 | Himes .................................... 525/98 |

FOREIGN PATENT DOCUMENTS

| | | | |
|---|---|---|---|
| 649873 | * | 10/1994 | (EP) . |
| 6-15649B2 | | 3/1994 | (JP) . |
| 7-188481A | | 7/1995 | (JP) . |
| 2529807B2 | | 6/1996 | (JP) . |

OTHER PUBLICATIONS

Shohji et al., translation of JP06–15649, 1994.*

* cited by examiner

Primary Examiner—Jeffrey Mullis
(74) Attorney, Agent, or Firm—Birch, Stewart, Kolasch, and Birch, LLP (57) ABSTRACT

A hydrogenated block copolymer comprising: at least two polymer blocks A mainly comprising vinylaromatic hydrocarbon compound monomer units; and at least two polymer blocks B mainly comprising hydrogenated conjugated diene compound monomer units, in which at least 90% of the olefinically unsaturated double bonds contained in the unhydrogenated polymer block mainly comprising the conjugated diene compound monomer units is hydrogenated, wherein at least one of the terminal blocks is a polymer block B, the proportion of the terminal polymer block B in the hydrogenated block copolymer being 0.1% by weight or higher and lower than 9.1% by weight, and wherein the content of the vinylaromatic hydrocarbon compound units in the hydrogenated block copolymer is 12% by weight or higher and lower than 25% by weight. Also disclosed are a resin composition containing the hydrogenated block copolymer, and a molded article of the resin composition.

10 Claims, 3 Drawing Sheets

HYDROGENATED BLOCK COPOLYMER AND COMPOSITION OF THE SAME

FIELD OF THE INVENTION

The present invention relates to a hydrogenated block copolymer which has a polymer block having a specific chain length and mainly comprising hydrogenated conjugated diene monomer units as at least one of the terminal blocks thereof and which comprises a specific content of polymer blocks mainly comprising vinylaromatic hydrocarbon compound units. The present invention also relates to a composition of the block copolymer and to a molded article of the composition.

BACKGROUND OF THE INVENTION

Conjugated diene polymers, on which many proposals have conventionally been made, are widely used, e.g., in tires, belts, impact modifiers for resins, pressure-sensitive adhesives, films and containers, mainly as elastomers, thermoplastic elastomers, and special transparent resins.

Typical known conjugated diene polymers include polybutadiene, polyisoprene, butadiene/isoprene copolymers, styrene/butadiene copolymers, styrene/isoprene copolymers, α-methylstyrene/butadiene copolymers, α-methylstyrene/isoprene copolymers, acrylonitrile/butadiene copolymers, acrylonitrile/isoprene copolymers, butadiene/methyl methacrylate copolymers, isoprene/methyl methacrylate copolymers, and hydrogenated polymers obtained therefrom.

On the other hand, block copolymers constituted of polymer blocks having a $T_g$ higher than room temperature (restrained phase) at both terminals thereof, and a polymer block having a $T_g$ lower than room temperature (rubbery phase) (e.g., styrene/butadiene (or isoprene)/styrene block copolymers and hydrogenated polymers obtained therefrom) interposed therebetween are widely used as thermoplastic elastomers, compatibilizing agents, and modifiers in many applications including injection molding and resin modification.

Blending of the styrene/butadiene (or isoprene)/styrene block copolymers or hydrogenated polymers obtained therefrom with other polymers, such as polystyrene, polyolefins, poly(phenylene ether), styrene/butadiene diblock copolymers, and hydrogenated polymers obtained from the diblock copolymers, to produce block copolymer compositions is widely conducted in order to improve the heat resistance, flowability, tackiness properties, and other properties of the styrene/butadiene (or isoprene)/styrene block copolymers or hydrogenated polymers obtained therefrom.

However, with the recent progress in technologies, the market demand for polymeric materials having even higher performances is becoming stronger, and there has been a strong desire for the development of a styrene-based thermoplastic elastomer having improved flowability and heat resistance. Although a styrene block copolymer having an improved balance between heat resistance and flowability has been obtainable, it has the following problems concerning moldability. When the styrene block copolymer is extrusion-molded into film, film breakage is apt to occur during film formation depending on molding conditions and the kind of the block copolymer, making stable film production impossible. Furthermore, when the styrene block copolymer is melt-blended with another resin and the blend is injection-molded, the resultant moldings have flow marks and hence a significantly impaired appearance. Consequently, there has been a strong desire for a styrene-based thermoplastic elastomer having an excellent balance among heat resistance, flowability and moldability.

One of the known effective means for meeting the above desire is to employ a radial block or to link a hydrogenated polybutadiene or hydrogenated polyisoprene block to an end of a styrene/hydrogenated polybutadiene (or hydrogenated polyisoprene)/styrene triblock polymer or of a similar triblock polymer to thereby improve the flowability of the block polymer. Another means is to blend a styrene/hydrogenated polybutadiene (or hydrogenated polyisoprene)/styrene triblock polymer or a similar triblock polymer with a styrene/hydrogenated polybutadiene (or hydrogenated polyisoprene) diblock polymer.

The present invention is based on a finding that a styrene/hydrogenated conjugated diene block copolymer upon melting, which is in a two-phase state (orderly state) consisting of a rubbery phase and a restrained phase, can be made to come into a single-phase state (disordered) at a lower temperature by regulating the block copolymer so as to contain a specific content of vinylaromatic hydrocarbon compound monomer units and a specific amount of a terminal hydrogenated conjugated diene block(s), and further based on a finding that due to the single-phase state (disorderly state) which the hydrogenated block copolymer undergoes, the copolymer alone or compositions containing the same can have even better moldability and excellent flowability and heat resistance.

Phase separation in molten block copolymers is described in *Rheology Symposium Preprints,* 43, p.169 (1995). It has been reported therein that styrene/hydrogenated polybutadiene/styrene block copolymers have various order-disorder transition temperatures depending on its styrene content and molecular weight. However, there is no description therein to the effect that order-disorder transition temperature is influenced by block arrangement, in particular that a block copolymer having a specific styrene content and containing a specific amount of terminal hydrogenated polybutadiene blocks has a considerably lowered order-disorder transition temperature. The present inventors have further found that hydrogenated block copolymers regulated to have a terminal hydrogenated conjugated diene block content not lower than 0.1% by weight and lower than 9.1% by weight, while maintaining the polystyrene chain length constant so as to have the same heat resistance, have a lowered order-disorder transition temperature and improved flowability, whereas hydrogenated block copolymers having a terminal hydrogenated conjugated diene block content out of the above range have an elevated order-disorder transition temperature or reduced flowability. As described above, regulating the content of vinylaromatic hydrocarbon compound monomer units to a value in a specific range and regulating the amount of terminal hydrogenated conjugated diene blocks to a value in the range of from 0.1 to 9.1%, excluding 9.1%, by weight are particularly important in the present invention from the standpoints of flowability, moldability, and heat resistance. It should however be noted that no report has so far been made on the fact that the presence of terminal hydrogenated conjugated diene blocks in a hydrogenated block copolymer in a specific amount as in the above range greatly improves the balance among flowability, heat resistance, and moldability of the copolymer.

Polyolefin resin compositions are widely used as mechanical parts, automotive parts, and the like because they are generally excellent in chemical resistance and mechanical properties. As a result of the recent trend toward size increase and wall thickness reduction in pursuit of functions and economy in various products, there is a desire for a polyolefin resin composition excellent in impact resistance, brittleness temperature, rigidity, surface hardness, and tensile elongation at break. In particular, tensile elongation at break is one of the highly desired properties. This is because polyolefin resin compositions, when used, for example, as an automotive material, are required not to break to scatter fragments upon impaction or required to deform to absorb impact, or because polyolefin resin compositions for use in the above applications are required not to break upon creep deformation.

A generally employed method for improving the impact resistance of polyolefin resins is to add an elastomer thereto. In *Kōbunshi Ronbun-shū*, Vol.50, No.2, pp.81–86 (Feb. 1993) are shown various properties of compositions comprising polypropylene and an ethylene/propylene rubber as an elastomer. This report shows that increasing the addition amount of the elastomer improves impact resistance and tensile elongation at break. It is also shown therein that although reducing the molecular weight of the polypropylene so as to improve alloy flowability is effective in improving flowability, it reduces impact resistance and tensile elongation at break. In *Kōbunshi Ronbun-shū*, Vol.50, No.1, pp.19–25 (Jan. 1993) is given a report showing that increasing the elastomer addition amount in compositions comprising polypropylene and an ethylene/propylene rubber impairs surface hardness.

Furthermore, many reports have conventionally been made on the addition of a hydrogenated block copolymer as a means for improving the impact resistance of polyolefin resins. In *Plastic Age,* Vol.42, p.117, Feb. (1996) are given results showing that in compositions comprising polypropylene and a hydrogenated block copolymer, increasing the addition amount of a hydrogenated styrene-based thermoplastic elastomer used as the hydrogenated block copolymer improves impact resistance but reduces rigidity. There also are results therein showing that although rigidity (flexural modulus) is improved by using an elastomer having a high styrene content, brittleness temperature is impaired thereby.

As apparent from the above, impact resistance, brittleness temperature, rigidity, surface hardness and tensile elongation at break are inconsistent with one another. It has hence been exceedingly difficult to obtain a highly improved balance among these properties.

In U.S. Pat. No. 4,168,286, there is claimed a hydrogenated block copolymer which has the structure of either a styrene/hydrogenated conjugated diene/styrene/hydrogenated polybutadiene block copolymer or a styrene/hydrogenated polybutadiene/styrene/hydrogenated conjugated diene block copolymer, and in which the 1,2-bond content in the hydrogenated polybutadiene block is from 1 to 10 mol %. However, in the hydrogenated block copolymers described in the Examples given in the above reference, the amount of the terminal hydrogenated polybutadiene block or terminal hydrogenated conjugated diene block is at least 20% by weight, which is outside the scope of the present invention. Moreover, in the above reference, there is no description nor suggestion concerning the effect of the amount of a terminal hydrogenated polybutadiene block or terminal hydrogenated conjugated diene block.

In JP-A-2-259151, there is claimed a stretchable nonwoven fabric comprising a styrene/hydrogenated polybutadiene/styrene/hydrogenated polybutadiene block copolymer. (The term "JP-A" as used herein means an "unexamined published Japanese patent application".) An Example given therein describes a styrene/hydrogenated polybutadiene/styrene/hydrogenated polybutadiene block copolymer in which the content of the terminal hydrogenated polybutadiene block is 10% by weight. However, this reference neither discloses a block copolymer having a terminal hydrogenated polybutadiene block in an amount below 10% by weight which is within the scope of the present invention, nor describes the effect thereof.

In JP-A-4-96904 and JP-A-4-96905, there is claimed a method for hydrogenating a styrene/butadiene block copolymer: An Example given in this reference describes a process in which a styrene/hydrogenated polybutadiene/styrene/hydrogenated polybutadiene block copolymer having a content of the terminal hydrogenated polybutadiene block of 10% by weight is produced.

In JP-A-5-038996, there is claimed an air bag cover housing comprising a hydrogenated conjugated diene block copolymer, a softener for rubber, and an olefin resin. An Example given in this reference describes an air bag housing material containing a styrene/hydrogenated polybutadiene/styrene/hydrogenated polybutadiene block copolymer in which the content of the terminal hydrogenated polybutadiene block is 10% by weight. However, the above two references each neither discloses a block copolymer having a terminal hydrogenated polybutadiene block in an amount smaller than 10% by weight, nor describes the effect thereof.

In JP-A-61-155446, there is claimed a composition comprising a hydrogenated block copolymer having a specific number-average molecular weight and a specific styrene content and having a specific amount of a hydrogenated polybutadiene block at the terminal thereof and a polyolefin. The Examples given therein describe compositions containing styrene/hydrogenated polybutadiene/styrene/hydrogenated polybutadiene block copolymers or hydrogenated polybutadiene/styrene/hydrogenated polybutadiene/styrene/hydrogenated polybutadiene block copolymers respectively having terminal hydrogenated polybutadiene block contents of 1.3, 2.5, 3, 5, 6.7, 10, 20, and 40% by weight. In the specification thereof, there is a description as to how the amount of the terminal hydrogenated polybutadiene block influences the mechanical strength and rubber elasticity of the composition. The composition claimed in this reference can have a styrene content of from 5 to 50% by weight, with the most preferred range thereof being from 10 to 40% by weight as described in the specification thereof. Although there is a description therein to the effect that the above range was employed in order to obtain desirable properties, there is no description nor suggestion therein concerning the relationship between the styrene content and a balance among impact resistance, brittleness temperature, rigidity, surface hardness and tensile elongation at break. Furthermore, the Examples given therein are limited to elastomer compositions having high elastomer contents, and no Example is given which relates to a resin composition showing a resin-modifying effect. In addition, there is no Example therein which relates to a composition produced by using a hydrogenated block copolymer containing a terminal hydrogenated polybutadiene block and having a vinylaromatic hydrocarbon content of 12% by weight or higher and lower than 25% by weight, which is one of the essential requirements in the present invention.

In Japanese Patent No. 2,500,391, there is claimed an elastomer composition which comprises a hydrogenated block copolymer having a hydrogenated polybutadiene block at an end, a polyolefin resin, and an ethylene/α-olefin copolymer, and which due to these components has the effect of being excellent in flexibility and processability and reduced in anisotropy. In this reference are given Examples concerning compositions containing a styrene/hydrogenated polybutadiene/styrene/hydrogenated polybutadiene block copolymer. In this reference, however, there is no description concerning the amount of the terminal hydrogenated polybutadiene block nor description suggesting the fact that the terminal hydrogenated polybutadiene block greatly improves the balance among impact resistance, brittleness temperature, rigidity, surface hardness and tensile elongation at break of the composition. In addition, the composition obtained according to this reference has an unsatisfactory balance among impact resistance, brittleness temperature, rigidity, surface hardness and tensile elongation at break.

Japanese Patent No. 2,529,807 discloses a composition obtained by compounding a polyolefin resin with a hydrogenated block copolymer and optionally further with an inorganic filler, for improving low-temperature impact strength and flowability/processability. In the Examples given therein are described compositions containing a hydrogenated block copolymer having the structure of polystyrene/hydrogenated polybutadiene (poly(ethylene-butylene)/polystyrene/hydrogenated polybutadiene. However, there is no description therein concerning an effect of the hydrogenated block copolymer used, although the vinyl content of the copolymer is shown. Furthermore, although the MFR, molecular weight, and styrene content of the hydrogenated block copolymer are shown in the above reference, there is no description therein concerning the relationship between these properties and tensile elongation at break. In addition, there is no description nor suggestion therein concerning the amount of a terminal hydrogenated polybutadiene chain and the effect thereof. Although this conventional technique is considerably effective in greatly improving flowability/processability, it is unsatisfactory in the improvement of tensile elongation at break.

JP-A-5-51494 discloses a composition comprising a polypropylene resin and two hydrogenated block copolymers having different molecular weights, for the purpose of improving low-temperature impact resistance, appearance properties and flowability/processability. In this reference are given Examples concerning compositions comprising a combination of a hydrogenated block copolymer having the structure of polystyrene/hydrogenated polybutadiene (poly(ethylene-butylene))/polystyrene/hydrogenated polybutadiene and a hydrogenated block copolymer having another structure. Although the influence of the microstructures of the conjugated diene compounds in the hydrogenated block copolymers used on low-temperature impact strength, rigidity and flowability/processability is shown in the above reference, there is no description therein concerning tensile elongation at break and surface hardness, and these two properties are not on a satisfactory level. In addition, there is no description nor suggestion therein concerning the amount of a terminal hydrogenated polybutadiene chain and the effect thereof.

JP-A-5-163388 discloses a composition which comprises a polypropylene resin and two hydrogenated block copolymers having different molecular weights and in which the hydrogenated block copolymer having a lower molecular weight is contained in a larger amount than the hydrogenated block copolymer having a higher molecular weight, for the purpose of improving the balance between low-temperature impact resistance and rigidity and improving flowability/processability. In this reference are given Examples concerning compositions containing a combination of hydrogenated block copolymers having the structure of polystyrene/hydrogenated polybutadiene (poly(ethylene-butylene)/polystyrene/hydrogenated polybutadiene and having different molecular weights. Although the influence of the microstructures of the conjugated diene compounds in the hydrogenated block copolymers used on low-temperature impact strength, rigidity, and flowability/processability is shown in the above reference, there is no description therein concerning tensile elongation at break and surface hardness and these two properties are not on a satisfactory level. In addition, there is no description nor suggestion therein concerning the amount of a terminal hydrogenated polybutadiene chain and an effect thereof.

JP-A-6-32947 discloses a composition obtained by compounding a polyolefin resin with a combination of hydrogenated block copolymers which differ in the microstructure of the conjugated diene block, for the purpose of improving the balance among practical low-temperature impact strength, heat deformation resistance and rigidity. In this reference are given Examples concerning compositions containing a combination of hydrogenated block copolymers having the structure of polystyrene/hydrogenated polybutadiene (poly(ethylene-butylene))/polystyrene/hydrogenated polybutadiene and differing in the microstructure of the conjugated diene block. Although the influence of the vinyl bond contents of the hydrogenated block copolymers used on impact strength, low-temperature impact strength and heat deformation resistance is shown in the above reference, there is no description therein concerning tensile elongation at break and surface hardness. In addition, there is no description nor suggestion concerning the amount of a terminal hydrogenated polybutadiene chain and an effect thereof. This conventional composition is not on a satisfactory level.

JP-A-7-188481 discloses a composition comprising a highly flowable polypropylene and a block copolymer having the structure of polystyrene/hydrogenated polyisoprene/polystyrene/hydrogenated polyisoprene, for the purpose of improving impact resistance, rigidity and heat deformation resistance. There is a description therein to the effect that by regulating the molecular weight of the terminal hydrogenated polyisoprene (so that the content thereof is from 9.17 to 23.1% by weight based on the whole block copolymer), the composition can be made to have excellent physical and appearance properties. Compositions in which the contents of the terminal hydrogenated polyisoprene block in the block copolymer are 11.7% by weight and 12.26% by weight are shown in Examples given in the above reference. However, not only the content of the terminal hydrogenated polyisoprene block in the block copolymer employed in this conventional composition is 9.17% by weight or higher, which is outside the scope of the present invention, but also there is no description therein concerning an effect which is produced when that content is lower than 9.17% by weight. Furthermore, there is no description in the above reference concerning the balance among impact resistance, brittleness temperature, rigidity, surface hardness and tensile elongation at break, and the conventional composition is unsatisfactory in that balance. In the Examples given therein are shown compositions employing a block copolymer obtained using isoprene as a conjugated diene compound. Although there is a description in the above reference to the effect that the isoprene block copolymer is more effective in property improvement than a butadiene block copolymer, there is no description nor suggestion concerning the relationship between MFR, microstructure, or the like and the effect of property improvement.

JP-A-8-20684 discloses a composition which comprises crystalline polypropylene and two hydrogenated block copolymers differing in melt flow rate (MFR) and in the content of a monovinyl-substituted aromatic hydrocarbon, and which is intended to be excellent in rigidity, heat deformation resistance and impact resistance and be satisfactory in appearance and moldability. There is a description therein to the effect that the composition tends to give moldings having flow marks and a poor appearance if the crystalline polypropylene has an MFR lower than 7 g/10 min or if one of the hydrogenated block copolymers has an MFR lower than 5 g/10 min. However, there is no description in the above reference concerning tensile elongation at break and surface hardness, and these properties of the conventional composition are not on a satisfactory level. Furthermore, there is no description nor suggestion therein concerning the amount of a terminal hydrogenated polybutadiene chain and the effect thereof.

JP-A-8-20690 discloses a composition obtained by compounding a polypropylene resin with polyethylene, an olefin elastomer, a hydrogenated block copolymer, and an inorganic filler, for the purpose of improving the balance among properties such as impact strength, injection moldability, rigidity, impact resistance and brittleness temperature. In this reference are given Examples concerning compositions containing a hydrogenated block copolymer having the structure of polystyrene/hydrogenated polybutadiene (poly (ethylene-butylene))/polystyrene/hydrogenated polybutadiene. Although the vinyl content of the hydrogenated block copolymer used is shown in the above reference, the effect thereof is not described. Furthermore, there is no description nor suggestion therein concerning the amount of a terminal hydrogenated polybutadiene chain and the effect thereof. This conventional technique is insufficient in the effect of improving hardness and tensile elongation at break, and a further improvement in this respect is desired.

As described above, a polyolefin resin composition has not yet been obtained which has an exceedingly good balance among impact resistance, brittleness temperature, rigidity, surface hardness and tensile elongation at break.

SUMMARY OF THE INVENTION

Under the above-described circumstances of the conventional techniques, an object of the present invention is to provide a thermoplastic elastomer having an excellent balance among heat resistance, flowability and moldability.

Another object of the present invention is to provide a polyolefin resin composition containing a hydrogenated block copolymer having a specific structure to give an excellent balance among impact resistance, brittleness temperature, rigidity, surface hardness and tensile elongation at break.

Other objects and effects of the invention will be apparent from the following description.

As a result of extensive studies made by the present inventors, they have found a hydrogenated block copolymer which effectively eliminates the above described problems in conventional.techniques, as described above. The present invention has been completed based on the finding.

That is, the above described objectives of the present invention have been achieved by providing:

a hydrogenated block copolymer comprising:

at least two polymer blocks A mainly comprising vinylaromatic hydrocarbon compound monomer units; and at least two polymer blocks B mainly comprising hydrogenated conjugated diene compound monomer units, in which at least 90% of the olefinically unsaturated double bonds contained in the unhydrogenated polymer block mainly comprising the conjugated diene compound monomer units is hydrogenated, wherein at least one of the terminal blocks is a polymer block B, the proportion of the terminal polymer block B in the hydrogenated block copolymer being 0.1% by weight or higher and lower than 9.1% by weight, and wherein the content of the vinylaromatic hydrocarbon compound units in the hydrogenated block copolymer is 12% by weight or higher and lower than 25% by weight.

The present invention also relates to a resin composition containing the hydrogenated block copolymer and to a molded article produced from the resin composition.

DETAILED DESCRIPTION OF THE INVENTION

The present invention is based on the finding that a hydrogenated block copolymer has an order-disorder transition temperature not higher than practical molding temperatures, by regulating the amount (proportion) of a terminal polymer block(s) B to within a specific range and the content of vinylaromatic hydrocarbon compound units to within a specific range. For example, an increase in the content of vinylaromatic hydrocarbon compound units results in an elevated order-disorder transition temperature when the number-average molecular weight is constant, while an increase in number-average molecular weight results also in an elevated order-disorder transition temperature when the content of vinylaromatic hydrocarbon compound units is constant. The present inventors have found that there is an important relationship between order-disorder transition temperature and moldability. The term "order-disorder transition temperature" as used herein means the temperature at which a hydrogenated block copolymer, which takes a two-phase separated state of a rubbery phase and a restrained phase around room temperature, comes into a single-phase state. The term "(excellent) moldability" as used herein has the following two meanings besides, simply, improved flowability. The first meaning of the moldability in the present invention is that when a hydrogenated block copolymer in a single-phase state (disorderly state) is extrusion-molded into a film, the extrudate is less apt to break in the space between the die and the wind-up roll as compared with extrudates formed from a hydrogenated block copolymer in a two-phase state (orderly state), whereby stable film production is possible. A conventional technique employed hitherto for avoiding film breakage or the like during extrusion molding has been to reduce the content of vinylaromatic hydrocarbon compound units in the hydrogenated block copolymer to be used, or to lower the number-average molecular weight of the block copolymer. However, these techniques have a problem that the molded article obtained has a reduced heat resistance.

Although a higher molding temperature has been used in some cases to cope with the film breakage, use of this technique has been limited, for example, because of the decomposition temperatures of the additives and of the block copolymer itself. There have been cases where block copolymers having the same melt viscosity differ in the moldability as explained above even when molded under the same conditions. The present inventors have found that this phenomenon also is attributed to a difference in order-disorder transition temperatures.

Furthermore, there have been cases where moldings obtained by melt-mixing a hydrogenated block copolymer with another resin and injection-molding the melt have flow marks on the surfaces thereof and hence have an impaired appearance. The present inventors have found that this phenomenon is also eliminated when a block copolymer having a lower order-disorder transition temperature is used (the second meaning of the moldability).

As described above, there is an important relationship between the order-disorder transition temperature of a hydrogenated block copolymer and the moldability thereof. It is therefore necessary to employ a method capable of lowering the order-disorder transition temperature without impairing other properties, e.g., heat resistance and flowability. Although the order-disorder transition temperature may be lowered by reducing the content of vinylaromatic hydrocarbon compound units or by lowering the number-average molecular weight, the hydrogenated block copolymer thus modified has reduced heat resistance. However, the present inventors have succeeded in lowering a an order-disorder transition temperature to within a practical molding temperature range taking into account the thermal stability, etc. of polymers without adversely influencing the heat resistance and flowability, by designing a hydrogenated block copolymer to have a vinylaromatic hydrocarbon content within a specific range and to have at least one terminal polymer block mainly comprising a hydrogenated conjugated diene monomer units, which terminal block accounts for a specific amount (proportion) in the molecule. For example, when a hydrogenated block copolymer having the structure of styrene/hydrogenated polybutadiene/styrene is compared with a hydrogenated block copolymer according to the present invention having the structure of styrene/hydrogenated polybutadiene/styrene/hydrogenated polybutadiene and having the same number-average molecular weight and the same styrene content as those of the former block copolymer, then the copolymer of the present invention has a lower order-disorder transition temperature and better moldability although the two copolymers have the same heat resistance due to the same number-average molecular weight and the same styrene content. The effect that the incorporation of a terminal hydrogenated polybutadiene block enables the hydrogenated block copolymer to be excellent in flowability, heat resistance and moldability is produced only when the hydrogenated block copolymer satisfies the requirements according to the present invention concerning the amount (proportion) of the terminal hydrogenated polybutadiene block and the vinylaromatic hydrocarbon (e.g., styrene) content.

The "flowability" used herein for a hydrogenated block copolymer is impaired when the melt viscosity thereof is high, and is improved when the melt viscosity thereof is low. As a measure of flowability is used the melt flow rate (MFR) in accordance with JIS K7210. Hydrogenated block copolymers having a high MFR are judged to have satisfactory flowability, while those having a low MFR are judged to have poor flowability. If a hydrogenated block copolymer having a low MFR is used, there may be cases where melt extrusion results in a reduced ejection amount and hence in reduced productivity. Generally employed techniques for improving the flowability of a hydrogenated block copolymer include lowering the number-average molecular weight thereof measured by GPC and calculated with standard polystyrene basis, and reducing the content of vinylaromatic compound monomer units while maintaining the same number-average molecular weight. However, these techniques impair the "heat resistance" of the hydrogenated block copolymer.

The "heat resistance" of a hydrogenated block copolymer can be judged based on a measurement of the softening temperature thereof in a temperature range above room temperature. Hydrogenated block copolymers having a low softening temperature are judged to have poor "heat resistance", while those having a high softening temperature are judged to have satisfactory "heat resistance". Softening temperature can be determined, for example, by dynamic viscoelasticity analysis in which the temperature dependency of storage modulus, loss modulus or loss tangent is examined in a temperature range of from 50 to 150° C. In the case where the temperature dependency of storage modulus is examined, the inflection point temperature of the resultant curve can be taken as the softening temperature. In the case of loss modulus or loss tangent, the peak temperature in the curve can be taken as the softening temperature.

The cases where a hydrogenated block copolymer or a composition thereof has "impaired moldability" include: the case where, even when a hydrogenated block copolymer has a low melt viscosity and being moldable, it causes breakages of a molten film-form extrudate during film formation, making stable molding impossible; and the case where a blend of the hydrogenated block copolymer with another resin, when melt-mixed and injection-molded, gives moldings having flow marks.

The hydrogenated block copolymer of the present invention may be blended with a polyolefin resin. In this case, the proportions of the former and the latter ingredients each may be from 1 to 99% by weight. This blending has the effect of imparting the excellent moldability according to the present invention. Furthermore, a resin composition comprising (1) from 60 to 99% by weight of polyolefin resin and (2) from 1 to 40% by weight of the hydrogenated block copolymer of the present invention is a composite material having an excellent balance among impact resistance, tensile elongation at break, brittleness temperature, surface hardness and rigidity. In this case, if the proportion of the hydrogenated block copolymer is smaller than 1% by weight, impact resistance, tensile elongation at break and brittleness temperature are impaired. If the proportion thereof exceeds 40% by weight, surface hardness and rigidity are impaired. The preferred range of the proportion of the hydrogenated block copolymer is from 2 to 20% by weight, excluding 20% by weight.

Namely, the resin composition of the present invention is based on a finding that a composition comprising a polyolefin resin and a hydrogenated block copolymer can have an excellent balance among impact resistance, tensile elongation at break, brittleness temperature, surface hardness and rigidity, when the hydrogenated block copolymer contains vinylaromatic compound monomer units in an amount within a given range and has a specific block arrangement. The present inventors made investigations based on the assumption that mechanical properties including brittleness temperature and tensile elongation at break are improved by improving the interfacial adhesion between polypropylene and a hydrogenated block copolymer. It is can be considered that a hydrogenated block copolymer having an increased molecular weight shows enhanced entanglement with polypropylene molecular chains during melt kneading to attain improved interfacial adhesion. It is thought that in order for the hydrogenated block copolymer to show sufficient entanglement with polypropylene molecular chains, the molecular weight thereof should be increased to some degree when the polypropylene molecular chains become shorter. That is, when polypropylene having a high molecular weight is used, the hydrogenated block copolymer may have a relatively small molecular weight. However, in the case where polypropylene having a reduced molecular weight is used in order to enhance alloy flowability in producing composition moldings, which are becoming large-sized in recent years, it cause necessity to use a hydrogenated block copolymer having an increased molecular weight. In addition, this technique has a problem that the hydrogenated block copolymer having an increased molecular weight has poor dispersibility under ordinary melt-kneading conditions, resulting in composition moldings having impaired mechanical properties. As a result of detailed investigations, the present inventors have found the optimal structure of a hydrogenated block copolymer which gives a composition improved in impact resistance, tensile elongation at break, brittleness temperature, surface hardness and rigidity even when the hydrogenated block copolymer is used in combination with polypropylenes of wide MFR range.

In a propylene block copolymer, homopolypropylene blocks constitute a continuous phase and ethylene/α-olefin blocks constitute a dispersed phase. It is presumed that when a hydrogenated block copolymer contained in this system is present at the interface between the propylene block copolymer dispersed phase and the homopolypropylene, interfacial adhesion is improved and, hence, tensile elongation at break and brittleness temperature are improved. The present inventors have found that a hydrogenated block copolymer having a specific structure can efficiently localize at the interface between the propylene block copolymer dispersed phase and the homopolypropylene and improve the interfacial bonding strength between the dispersed phase and the homopolypropylene.

The present invention is explained in more detail below.

The polyolefin resin (1) for use in the present invention may be any resin obtained by polymerizing at least one monomer selected from ethylene, α-olefins having 3 to 12 carbon atoms, e.g., propylene, 1-butene, isobutylene, and 4-methyl-1-pentene, and the like. Specific examples thereof include homopolymers of ethylene, butene, methylpentene, and propylene, propylene block copolymers, propylene random copolymers, and mixtures thereof. Polyolefins having different molecular weights or different composition may be mixed. Especially preferred are propylene block copolymers. Comonomers for block or random copolymers of propylene include ethylene and α-olefins other than propylene. Among these, ethylene is preferred. These copolymers desirably have a propylene content of at least 55 mol %. In a propylene block copolymer produced using ethylene or an α-olefin as a comonomer, the homopolypropylene blocks constitute a continuous phase and the ethylene or α-olefin blocks constitute a dispersed phase. The content of this dispersed phase is desirably from 5 to 30% by weight based on the propylene block copolymer. This dispersed phase may contain polyethylene. In the present invention, the melt flow rate (in accordance with JIS K7210, conditions L) of the polypropylene resin is preferably from 0.1 to 200 g/10 min, and is more preferably not lower than 30 g/10 min from the standpoint of rigidity. For producing the polyolefin resin, any of conventionally known polymerization methods may be used. Examples thereof include transition polymerization, radical polymerization and ionic polymerization.

The hydrogenated block copolymer (2) for use in the present invention comprises at least two polymer blocks A each mainly comprising vinylaromatic hydrocarbon compound monomer units and at least two polymer blocks B each mainly comprising hydrogenated conjugated diene compound monomer units. As the vinylaromatic hydrocarbon compound monomer units, one or more kinds of monomers selected, for example, from styrene, alkylstyrenes such as a-methylstyrene, p-methylstyrene and p-tert-butylstyrene, p-methoxystyrene, vinylnaphthalene, and the like can be used. Preferred among these is styrene. The content of such vinylaromatic compound monomer units in the block copolymer is from 12 to 25% by weight, excluding 25% by weight, and is preferably from 14 to 25% by weight, excluding 25% by weight, from the standpoints of brittleness temperature, surface hardness and rigidity. If the content thereof is lower than 12% by weight, surface hardness and rigidity are impaired. If the content thereof is 25% by weight or higher, it heightens the brittleness temperature.

The content of vinylaromatic compound monomer units can be measured with a nuclear magnetic resonance spectrometer (NMR), an ultraviolet spectrometer (UV), etc. The words "mainly comprising" as used herein, for example, the words "mainly comprising vinylaromatic compound monomer units" includes the case where the units are composed of one or more kinds of vinylaromatic monomers and the case where one or more kinds of vinylaromatic monomers are copolymerized with one or more kinds of other monomers capable of undergoing living anionic polymerization therewith. Examples of the copolymerizable monomers include conjugated diene compound monomers, methacrylic esters such as methyl methacrylate and butyl methacrylate, cyclohexadiene, and caprolactones. The mode of copolymerization is not particularly limited, and may be any of random, alternating, taper, etc. A plurality of the polymer blocks A may differ from one another in composition, molecular weight, etc.

As the conjugated diene compounds, one or more kinds of compounds selected, for example, from butadiene, isoprene, 1,3-cyclohexadiene, 1,3-pentadiene, 2,3-dimethyl-1,3-butadiene, and the like can be used. Especially preferred among these are butadiene, isoprene, and combined use of these. The microstructure of the unhydrogenated polymer block mainly comprising conjugated diene compound monomer units may be appropriately selected. For example, in the case of polybutadiene blocks, the 1,2-bond content thereof is preferably higher than 35 mol % and lower than 90 mol %, more preferably not lower than 40 mol % and lower than 60 mol %, and further preferably higher than 50 mol % and lower than 60 mol %. If the 1,2-bond content thereof is lower than 40 mol %, the tensile elongation at break is impaired. If the 1,2-bond content thereof is 60 mol % or higher, the brittleness temperature is heightened. In polyisoprene blocks, the 3,4-bond content thereof is preferably higher than 0 mol % and lower than 40 mol %. If the 3,4-bond content thereof is 40 mol % or higher, the brittleness temperature is heightened. The microstructure can be determined with a nuclear magnetic resonance spectrometer (NMR). The term "mainly comprising diene compound monomer units" includes the case in which a conjugated diene compound is copolymerized with one or more other monomers capable of undergoing living anionic polymerization therewith. Examples of these copolymerizable monomers include vinylaromatic compound monomers, methacrylic esters such as methyl methacrylate and butyl methacrylate, cyclohexadiene, and caprolactones. The mode of copolymerization is not particularly limited, and may be any of random, alternating, taper, etc. A plurality of the polymer blocks B may differ from one another in composition, molecular weight, etc.

The term "mainly comprising" as used herein for a polymer block means that the content of the monomer units concerned is higher than 50 mol %, preferably at least 70 mol %, based on the polymer block.

In the hydrogenated block copolymer of the present invention, at least 90% of the olefinically unsaturated double bonds contained in the unhydrogenated polymer block mainly comprising the conjugated diene compound monomer units is hydrogenated. If the degree of hydrogenation thereof is lower than 90%, the interfacial adhesion between the block copolymer and a polyolefin is reduced, so that the resultant composition has reduced impact resistance and reduced tensile elongation at break and deteriorates by the action of heat, light, etc. to come to have impaired thermoplasticity. In the blocks A, up to 20% of all unsaturated double bonds contained in the benzene rings of the vinylaromatic compound units may be hydrogenated. The degree of hydrogenation can be determined with a nuclear magnetic resonance spectrometer (NMR).

The hydrogenated block copolymer preferably has a melt flow rate (MFR) of from 1.0 to 15 g/10 min, excluding 15 g/10 min, as measured in accordance with JIS K7210 under the conditions of a temperature of 230° C. and a load of 2.16 kg. The more preferred range thereof is from 3.0 to 10 g/10 min. If the MFR thereof is lower than 1.0 g/10 min, impact resistance is impaired. If the MFR thereof is 15 g/10 min or higher, sufficient tensile elongation at break is not obtained. In the present invention, the hydrogenated block copolymer may have any structure such as, e.g., a linear, branched, radial, or comb-shaped structure. However, the hydrogenated block copolymer should be constituted of at least two polymer blocks each mainly comprising vinylaromatic hydrocarbon compound monomer units and at least two polymer blocks B each mainly comprising hydrogenated conjugated diene compound monomer units. Furthermore, at least one of the terminal blocks should be a polymer block B. Preferred examples of the block arrangement include A-B-A-B and B-A-B-A-B. In the case where neighboring blocks are connected by a random copolymer, this random copolymer may have a tapered structure in which the composition thereof changes gradually.

The terminal polymer block(s) B respectively account for a proportion of from 0.1 to 9.1% by weight, excluding 9.1% by weight, based on the weight of the hydrogenated block copolymer. From the standpoints of brittleness temperature and tensile elongation at break, the proportion thereof is preferably from 0.3 to 7.5% by weight, more preferably from 3 to 5.0% by weight, excluding 3 and 5.0% by weight. If the proportion thereof is lower than 0.1% by weight, tensile elongation at break is impaired. If the proportion thereof is 9.1% by weight or higher, the hydrogenated block copolymer is impaired in brittleness temperature. For example, in the case where the hydrogenated block copolymer has a block arrangement of A-B-A-B, the proportion of the terminal polymer block B in the whole block copolymer should be in the range of from 0.1 to 9.1% by weight, excluding 9.1% by weight. In the case where the hydrogenated block copolymer has a block arrangement of B1-A-B2-A-B3 (B1, B2, B3: polymer block mainly comprising hydrogenated conjugated diene compound monomer units), the proportion of the terminal polymer block B1 in the whole block copolymer should be in the range of from 0.1 to 9.1% by weight, excluding 9.1% by weight, and the proportion of the terminal polymer block B3 in the whole block copolymer should be also in the range of from 0.1 to 9.1% by weight, excluding 9.1% by weight.

The order-disorder transition temperature of the hydrogenated block copolymer according to the present invention is preferably not higher than 260° C., more preferably not higher than 230° C., from the standpoint of attaining satisfactory tensile elongation at break. In the case where the composition is molded at a temperature not lower than the order-disorder transition temperature of the hydrogenated block copolymer, the resultant composition molding has improved tensile elongation at break. The present inventors presume that the reasons for this effect are as follows. When the hydrogenated block copolymer in which phase separation has disappeared is melt-kneaded with a polyolefin resin, molecular chains of the hydrogenated block copolymer are more apt to be entangled with molecular chains of the polyolefin resin as compared when maintaining the two-phase state of the hydrogenated block copolymers during melting. When the molten composition in such an entangled state is cooled and undergo phase separation, the interfacial adhesion strength between the dispersed phase and the continuous phase is improved due to the anchoring effect of the hard domains. The present inventors have furthermore found that use of a propylene block copolymer is preferred in that the hydrogenated block copolymer can be efficiently present at the interface between the propylene block copolymer dispersed phase and homopolypropylene to improve interfacial bonding strength, whereby tensile elongation at break and other properties can be further improved. Since polyolefin resin compositions are preferably molded at a molding temperature of 260° C. or lower, more preferably 230° C. or lower, from the standpoint of avoiding the deterioration of the additives and the resin, etc., the order-disorder transition temperature of the hydrogenated block copolymer is preferably 260° C. or lower, more preferably 230° C. or lower, from the standpoint of obtaining composition moldings having improved tensile elongation at break. The molded articles obtained by molding the composition of the present invention at a temperature not lower than the order-disorder transition temperature of the hydrogenated block copolymer are suitable for use as automotive exterior materials such as bumpers and automotive interior materials such as instrument panels and air bag covers. The term "molding temperature" means the temperature at which a composition is melt-kneaded and formed, the temperature at which a composition obtained is formed, etc. The term "order-disorder transition temperature" means the temperature at which a two-phase separated state of a rubbery phase and a restrained phase which a hydrogenated block copolymer takes around room temperature disappears. The order-disorder transition temperature can be determined by small-angle X-ray scattering analysis or rheological analysis. In determining the order-disorder transition temperature of a hydrogenated block copolymer by Theological analysis, the copolymer is examined for dynamic storage modulus (G') and loss modulus (G") at various temperatures in a sufficient shear rate range, and the found values of G' are plotted against those of G". The order-disorder transition temperature can be determined from the temperature at which the resultant straight line comes to have the same gradient and the same intercept. Alternatively, the temperature dependency of G' is measured from the higher-temperature side at a sufficiently low frequency, e.g., 0.1 Hz or lower, and the order-disorder transition temperature can be determined from the inflection point appearing on the higher-temperature side. The hydrogenated block copolymer of the present invention has a number-average molecular weight as calculated with standard polystyrene basis of preferably from 35,000 to 200,000, more preferably from 40,000 to 150,000, excluding 150,000. If the number-average molecular weight of the hydrogenated block copolymer is lower than 35,000, the copolymer does not have the general functions of elastomers and does not give a composition having desired properties. If the number-average molecular weight of the hydrogenated block copolymer exceeds 200,000, the copolymer has an elevated order-disorder transition temperature, impaired moldability, reduced flowability, and poor handleability. The values of number-average molecular weight are those calculated with standard polystyrene basis in gel permeation chromatography (GPC) using a commercial standard polystyrene for GPC calibration curve drawing.

The hydrogenated block copolymer of the present invention can be produced, for example, by any of the polymerization methods described, e.g., in JP-B-36-19286, JP-B-43-14979, and JP-B-49-36957 so as to be within the scope of the present invention. (The term "JP-B" as used herein means an "examined Japanese patent publication".) In these methods, a vinylaromatic monomer is block-copolymerized with butadiene monomer in a hydrocarbon solvent using an anionic-polymerization initiator, e.g., an organolithium compound, and a vinylating agent, e.g., an ether compound such as diethyl ether and tetrahydrofuran or a tertiary amine such as triethylamine and N,N,N',N'-tetramethylethylenediamine, and optionally further using as a coupling agent a polyfunctional compound such as, e.g., epoxidized soybean oil and silicon tetrachloride, whereby a block copolymer having a linear, branched, or radial structure is obtained. The block copolymer thus produced is hydrogenated by a known method, e.g., the method described in JP-B-42-87045, whereby the hydrogenated block copolymer of the present invention is obtained.

The resin composition of the present invention can be prepared in accordance with the intended proportions of the individual ingredients by using a suitable apparatus for use in mixing ordinary polymeric substances. Examples of such mixing apparatuses include kneading machines such as a Banbury mixer, Labo Plastomill, single-screw extruder and twin-screw extruder. A melt-mixing method using an extruder is preferred from the standpoints of productivity and high kneading effect.

In the hydrogenated block copolymer for use in the present invention, part or all of the molecules thereof may have been modified so as to have a functional group through addition reaction with an unsaturated carboxylic acid or a derivative thereof. The hydrogenated block copolymer may be used in combination with another hydrogenated block copolymer which differs therefrom in composition or structure, or with an olefin elastomer such as, e.g., an ethylene/propylene rubber, an ethylene/butylene rubber, an ethylene/octene rubber, another ethylene/α-olefin copolymer rubber, or an ethylene/propylene/unconjugated diene terpolymer rubber. The resin composition of the present invention comprising a polyolefin resin (1) and a hydrogenated block copolymer (2) can be mixed with from 1 to 30 parts by weight of an olefin elastomer (3) per 100 parts by weight of the resin composition.

Additives such as, e.g., an inorganic filler, stabilizer, lubricant, colorant, silicone oil and flame retardant can be added to the composition of the present invention. Examples of the inorganic filler include calcium carbonate, talc, magnesium hydroxide, mica, barium sulfate, silica (white carbon), titanium oxide, and carbon black. In the present invention, the composition (I) comprising a polyolefin resin (1) and a hydrogenated block copolymer (2), or the composition (II) comprising a polyolefin resin (1), a hydrogenated block copolymer (2) and an olefin elastomer (3) preferably contains from 5 to 50 parts by weight of an inorganic filler (4) per 100 parts by weight of the respective composition (I) or (II) from the standpoint of rigidity. Examples of the stabilizer include conventionally known stabilizers such as hindered phenol type antioxidants, phosphorus-based heat stabilizers, hindered amine type light stabilizers, and benzotriazole type UV absorbers. Examples of the lubricant include stearic acid, stearamide, stearic esters, metal salts and other compounds of stearic acid, amorphous silica, and talc.

The present invention will be explained below in greater detail by reference to Examples, but the invention should not be construed as being limited thereto.

The following Examples 1 to 4 and comparative Examples 1 to 5 are directed to hydrogenated block copolymers and compositions thereof.

Analyses and evaluations were conducted by the following methods.

Determination of Styrene Content in Block Copolymer

The absorbance of a chloroform solution of a hydrogenated block copolymer at 254 nm was measured with an ultraviolet spectrometer. The styrene content of the hydrogenated block copolymer was determined from a calibration curve obtained beforehand by determining the relationship between styrene content and absorbance.

Determination of the Content of Terminal Polymer Block B

A polymer was sampled before and after the polymerization for incorporating an unhydrogenated terminal polymer block B, and the two samples were analyzed with an ultraviolet spectrometer to determine the styrene content in each polymer. From the difference in styrene content between the two polymer samples, the proportion of a terminal polymer block B in the hydrogenated block copolymer was determined.

Molecular Weight calculated with Standard Polystyrene Basis

The molecular weight was calculated in gel permeation chromatography (GPC) using a commercial standard polystyrene for GPC calibration curve drawing.

Melt Flow Rate (MFR)

MFR was measured in accordance with JIS K7210 under the conditions of a load of 2.16 kg and a temperature of 230° C.

Softening Temperature

Measurement was made with mechanical spectrometer RMS800, manufactured by Rheometrics Inc., under the conditions of a frequency of 6.28 rad/sec, 25-mm parallel plate, and a heating rate of 3° C./min to determine the peak temperature for loss modulus in the range of from 50 to 150° C.

Moldability into Film

A hydrogenated block copolymer was melted in a 25-mm extruder regulated so as to enable the block copolymer to be ejected through a T-die at a temperature of 260° C. or 230° C. The melt was extruded with the T-die and wound up to form a film. At each temperature, film winding was conducted at a constant rate and the screw rotational speed of the extruder was regulated so as to result in the same polymer ejection amount. The polymers which could be wound up are indicated by 0, while those which broke in the space between the T-die and the wind-up roll are indicated by x.

Appearance of Molded Article

Using a twin-screw extruder, a hydrogenated block copolymer was melt-mixed with homopolypropylene (M1600, manufactured by Asahi Kasei Kogyo Kabushiki Kaisha, Japan) in a proportion of 80/20 (by weight) and pelletized. The resultant pelletized composition was introduced into an injection molding machine regulated so as to have a resin temperature of 230° C., and flat plates having a thickness of 2 mm, a width of 10 mm, and a length of 10 mm were molded under the following conditions. The molded articles obtained were visually examined for flow marks. The molded articles having a satisfactory appearance with no flow marks are indicated by o, while those having a poor appearance are indicated by x.

Injection rate: low

Mold temperature: 40° C.

Determination of Order-Disorder Transition Temperature

Using mechanical spectrometer RMS800, manufactured by Rheometrics Inc., G' and G" were measured at different temperatures under the conditions of 25-mm parallel plate and frequencies of from 0.1 rad/sec to 100 rad/sec. The temperature at which the gradient of the straight line obtained by plotting G' against G" came to change was taken as the order-disorder transition temperature.

Preparation of Hydrogenation Catalyst

Two liters of dried and purified cyclohexane was introduced into a reactor the atmosphere in which had been replaced with nitrogen. Therein was dissolved 40 mmol of bis ($\eta^5$-cyclopentadienyl)titanium di(chloride). A cyclohexane solution containing 60 mmol of n-butyllithium was added to the solution, and the resultant mixture was reacted at 25° C. for 5 minutes. Immediately thereafter, 40 mmol of n-butanol was added thereto and this mixture was stirred and stored at room temperature. The resultant solution is referred to as "hydrogenation catalyst solution a".

Preparation of Dilithium Catalyst

A dilithium catalyst was obtained by the method described in *Macromolecules, Vol.29, No.19, 1996*. The starting materials used were commercial materials having the highest purity. Prior to use, the dilithium catalyst was partly deactivated with water and then analyzed by GC-MS to ascertain that it had a degree of dilithium incorporation of 100%.

EXAMPLE 1

First-Stage Polymerization

Into a 100-L (liter) autoclave the atmosphere in which had been replaced with nitrogen were introduced 28.6 L of dried and purified cyclohexane, 5.72 g of tetramethylethylenediamine, and 2.09 kg of a styrene/cyclohexane mixture having a styrene content of 33 wt %. After the contents were heated to 70° C., a cyclohexane solution containing 7.7 g of n-butyllithium was added thereto to carry out polymerization.

Second-Stage Polymerization

Subsequently to completion of the styrene polymerization as the first stage, 16.1 kg of a 1,3-butadiene/cyclohexane mixture having a 1,3-butadiene content of 33 wt % was added to carry out polymerization.

Third-Stage Polymerization

After completion of the 1,3-butadiene polymerization as the second stage, 2.09 kg of styrene/cyclohexane mixture having a styrene content of 33 wt % was added to carry out polymerization.

The polystyrene/polybutadiene/polystyrene block copolymer (SBS1) obtained in this stage was sampled and examined for styrene content. As a result, the styrene content thereof was found to be 20.6 wt %.

Fourth-Stage Polymerization

Subsequently, 927 g of a 1,3-butadiene/cyclohexane mixture having a 1,3-butadiene content of 33 wt % was introduced into the autoclave to carry out polymerization.

Figure 1:
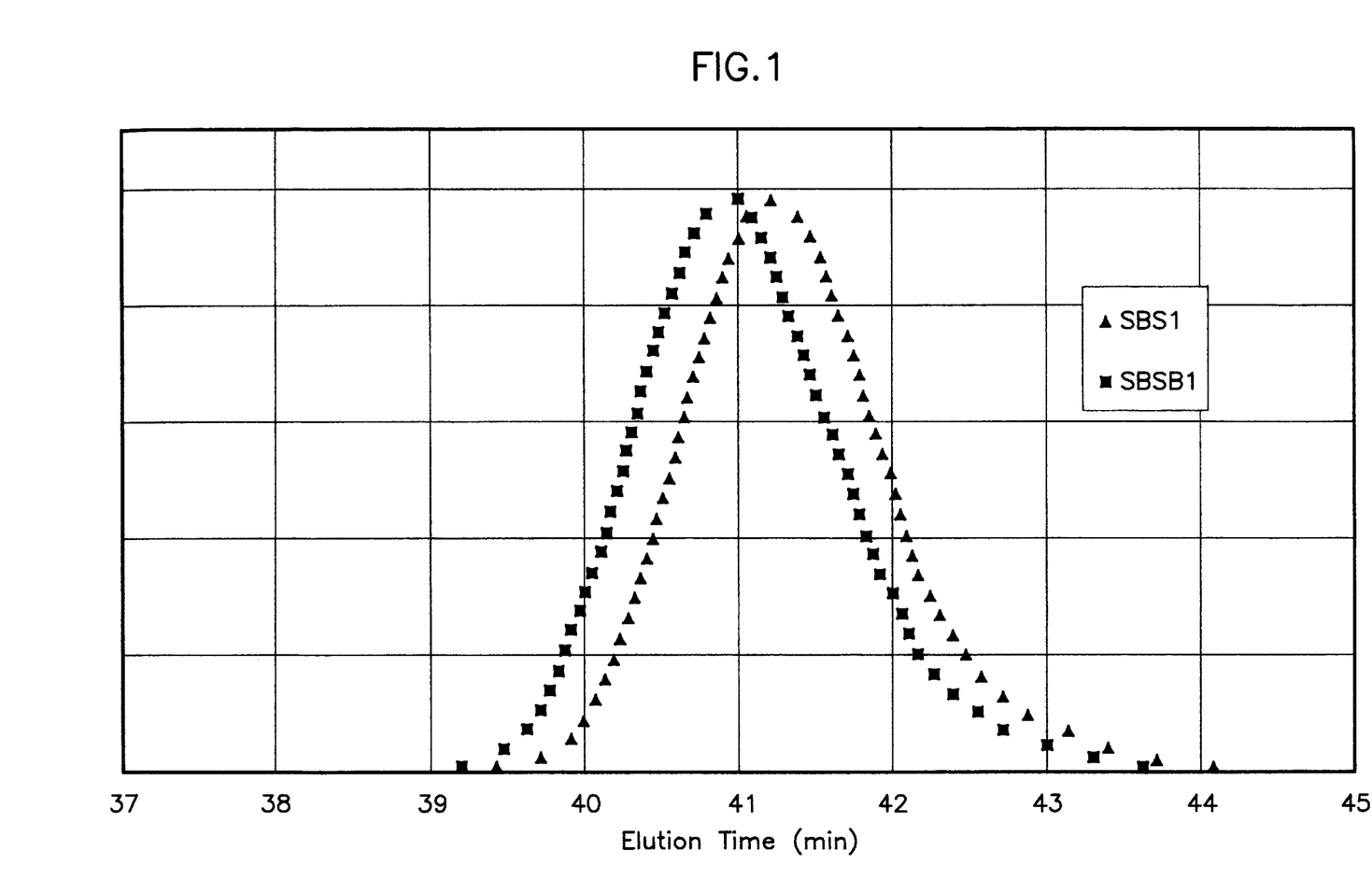
FIG. 1 shows GPC curves of SBS1 and SBSB1, both obtained in Example 1.

Thereafter, 2.5 g of methanol was added to obtain a polystyrene/polybutadiene/polystyrene/polybutadiene block copolymer (SBSB1) which had a styrene content of 19.7 wt % and in which the polybutadiene blocks had a 1,2-bond content of 41.8 mol %. A comparison in GPC curve between SBS1 and SBSB1 revealed that SBSB1 had a shorter elution time and hence had an increased molecular weight. The GPC curves for SBS1 and SBSB1 are shown in FIG. 1. The proportion of the terminal polybutadiene chain was determined from the change in styrene content, and was found to be 4.37 wt %.

Hydrogenation

Figure 2:
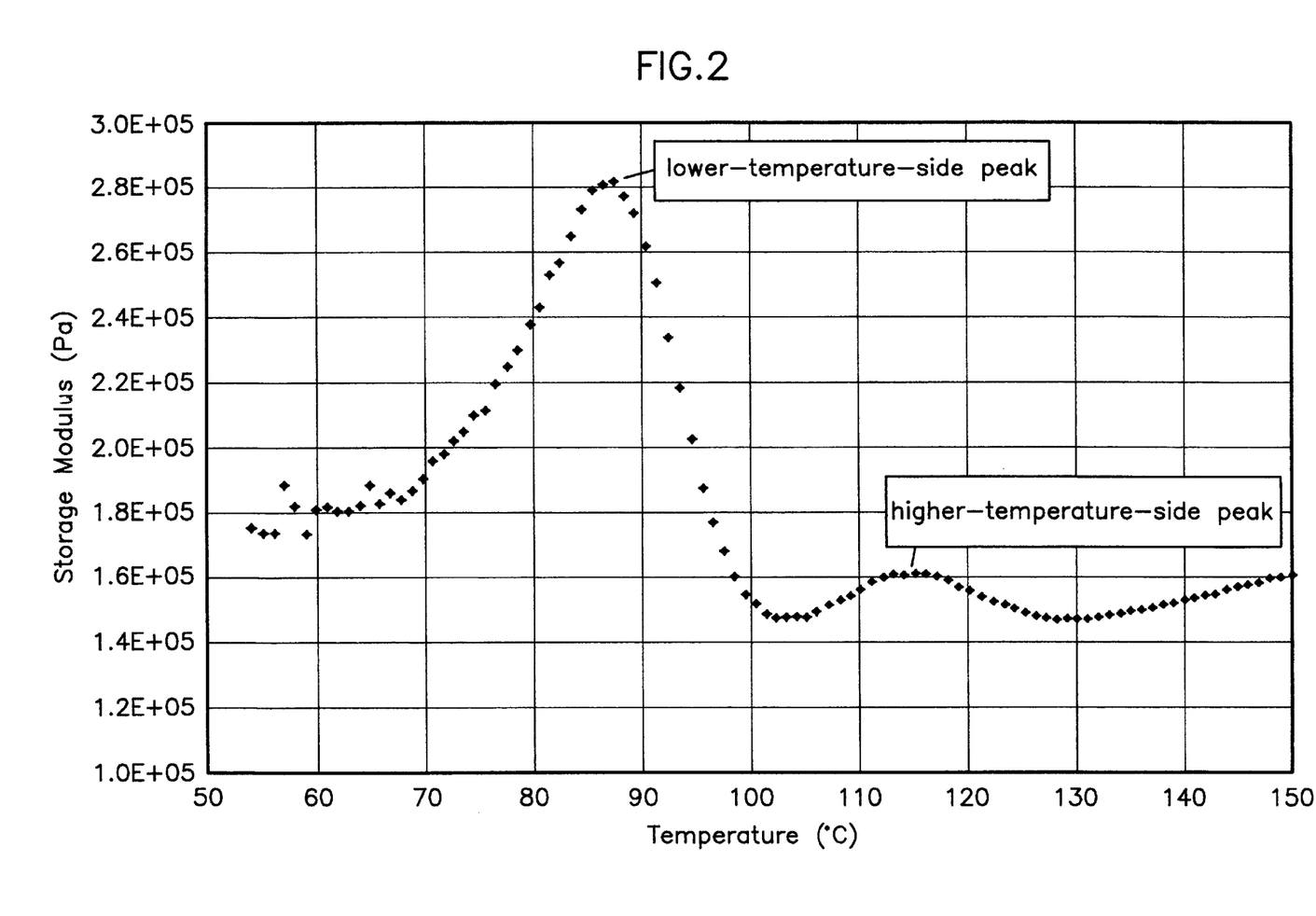
FIG. 2 shows the measurement results regarding the temperature dependency of the loss modulus of a hydrogenated block copolymer (SEBS1) obtained in Example 1.

Cyclohexane was then introduced into the autoclave in such an amount as to result in a polymer concentration of 12 wt %. The atmosphere inside the autoclave was replaced with hydrogen to adjust the hydrogen pressure to 0.7 MPa (gauge pressure), and the contents were heated to 70° C. Subsequently, hydrogenation catalyst solution a was added thereto in such an amount that the amount of the titanium contained therein was 30 ppm of the polymer, and hydrogen was continuously fed for 1 hour so as to maintain a hydrogen pressure of 0.7 MPa (gauge pressure). Finally, an A-B-A-B type hydrogenated block copolymer (SEBS1) was obtained which had a degree of hydrogenation of 99.8% and a molecular weight calculated with standard polystyrene basis of 115,000. The structure, results of various analyses, and moldability of the hydrogenated block copolymer obtained are shown in Tables 1 and 3. The block copolymer obtained in Example 1 was examined for the temperature dependency of loss modulus, and the results obtained are shown in FIG. 2.

EXAMPLE 2

Polymerizations and hydrogenation were conducted under the same conditions as in Example 1, except that 1,942 g of a 1,3-butadiene/cyclohexane mixture having a 1,3-butadiene content of 33 wt % was added for carrying out the fourth-stage polymerization. Thus, a hydrogenated block copolymer (SEBS2) was obtained. The structure, results of various analyses, and moldability of the hydrogenated block copolymer obtained are shown in Tables 1 and 3.

EXAMPLE 3

First-Stage Polymerization

Into a 100-L autoclave the atmosphere in which had been replaced with nitrogen were introduced 48.6 L of dried and purified cyclohexane, 5.72 g of tetramethylethylenediamine, and 15.2 kg of a 1,3-butadiene/cyclohexane mixture having a 1,3-butadiene content of 33 wt %. After the contents were heated to 70° C., a dilithium catalyst containing 0.120 mol of lithium was added thereto to carry out polymerization.

Second-Stage Polymerization

Subsequently to completion of the 1,3-butadiene polymerization as the first stage, 4.18 kg of a styrene/cyclohexane mixture having a styrene content of 33 wt % was added to carry out polymerization. The polystyrene/polybutadiene/polystyrene block copolymer obtained in this stage was sampled and examined for styrene content. As a result, the styrene content thereof was found to be 21.4 wt %.

Third-Stage Polymerization

After completion of the styrene polymerization as the second stage, 1.85 kg of a 1,3-butadiene/cyclohexane mixture having a 1,3-butadiene content of 33 wt % was added to carry out polymerization.

Thereafter, 2.5 g of methanol was added to obtain a polybutadiene/polystyrene/polybutadiene/polystyrene/polybutadiene lock copolymer which had a styrene content of 19.4 wt % and in which the polybutadiene blocks had a 1,2-bond content of 41.7 mol %. Since a dilithium catalyst had been used for the polymerizations, the two terminal polybutadiene blocks had the same molecular weight. The proportion of each terminal polybutadiene chain was determined from the change in styrene content, and was found to be 4.67 wt %. (Hydrogenation)

Thereafter, the atmosphere inside the autoclave was replaced with hydrogen to adjust the hydrogen pressure to 0.7 MPa (gauge pressure), and the contents were heated to 70° C. Subsequently, hydrogenation catalyst solution was added thereto in such an amount that the amount of the titanium contained therein was 100 ppm of the polymer, and hydrogen was continuously fed for 1 hour so as to maintain a hydrogen pressure of 0.7 MPa (gauge pressure). Finally, a B-A-B-A-B type hydrogenated block copolymer (SEBS3) was obtained which had a degree of hydrogenation of 99.8% and a molecular weight calculated with standard polystyrene basis of 115,000. The structure, results of various analyses, and moldability of the hydrogenated block copolymer obtained are shown in Tables 1 and 3.

EXAMPLE 4

Figure 3:
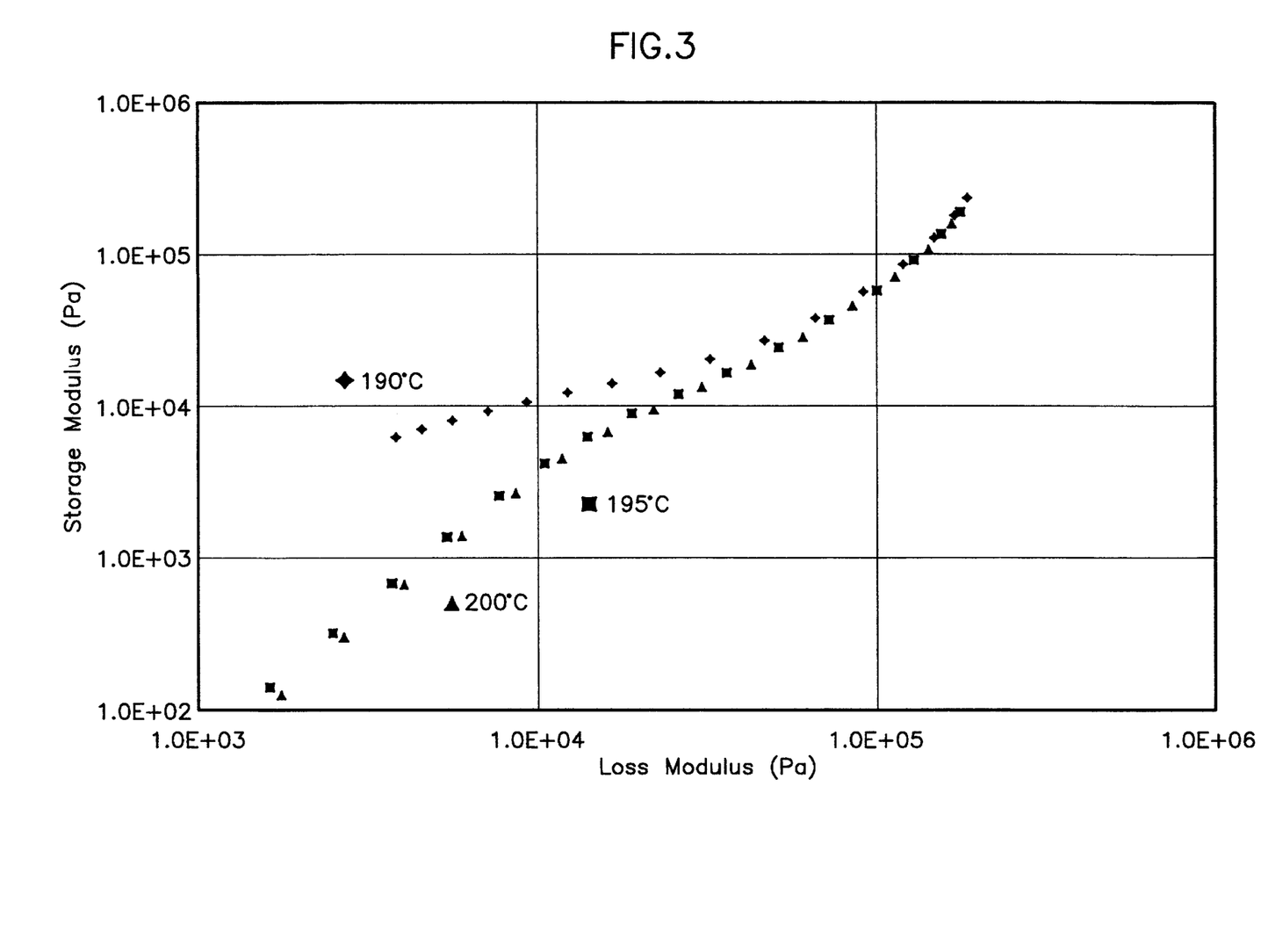
FIG. 3 shows plots of storage modulus against loss modulus at different temperatures for a hydrogenated block copolymer (SEBS4) obtained in Example 4. The order-disorder transition temperature of SEBS4 is higher than 190° C. and not higher than 195° C.

Polymerizations and hydrogenation were conducted under the same conditions as in Example 1, except that the amounts of n-butyllithium and tetramethylethylenediamine used in the first stage were changed. Thus, a hydrogenated block copolymer (SEBS4) was obtained. The structure, results of various analyses, and moldability of the hydrogenated block copolymer obtained are shown in Tables 1 and 3. A plot of storage modulus (G') against loss modulus (G") at different temperatures is shown in FIG. 3. The order-disorder transition temperature (MST) of the hydrogenated block copolymer was 190° C.<MST≦195° C.

Comparative Example 1

Polymerizations and hydrogenation were conducted under the same conditions as in Example 1, except that 3,059 g of a 1,3-butadiene/cyclohexane mixture having a 1,3-butadiene content of 33 wt % was added for carrying out the fourth-stage polymerization. Thus, a hydrogenated block copolymer (SEBS5) was obtained. The structure, results of various analyses, and moldability of the hydrogenated block copolymer obtained are shown in Tables 1 and 3.

Comparative Example 2

Polymerizations and hydrogenation were conducted under the same conditions as in Example 1, except that the amounts of n-butyllithium and tetramethylethylenediamine used in the first stage were changed. Thus, a hydrogenated block copolymer (SEBS6) was obtained. The structure, results of various analyses, and moldability of the hydrogenated block copolymer obtained are shown in Tables 1 and 3.

Comparative Example 3

Polymerizations and hydrogenation were conducted under the same conditions as in Example 1, except that the amounts of n-butyllithium and tetramethylethylenediamine used in the first stage were changed, that the amount of the styrene/cyclohexane mixture having a styrene content of 33 wt % added in the first and third stages was changed to 4.14 kg, and that the amount of the 1,3-butadiene/cyclohexane mixture having a 1,3-butadiene content of 33 wt % added in the second stage was changed to 12.0 kg. Thus, a hydrogenated block copolymer (SEBS7) was obtained. The structure, results of various analyses, and moldability of the hydrogenated block copolymer obtained are shown in Tables 1 and 3.

Comparative Example 4

Polymerizations and hydrogenation were conducted under the same conditions as in Example 1, except that the fourth-stage polymerization was omitted. Thus, a hydrogenated block copolymer (SEBS8) was obtained. The structure, results of various analyses, and moldability of the hydrogenated block copolymer obtained are shown in Tables 1 and 3.

Comparative Example 5

Polymerizations and hydrogenation were conducted under the same conditions as in Comparative Example 4, except that the amounts of n-butyllithium and tetramethylethylenediamine used in the first stage were changed. Thus, a hydrogenated block copolymer (SEBS9) was obtained. The structure, results of various analyses, and moldability of the hydrogenated block copolymer obtained are shown in Tables 1 and 3.

TABLE 1

| | Structure | Kind of conjugated diene (component B) | Content of one terminal polymer block B (wt %) | Degree of hydrogenation (%) | Styrene content (wt %) | Average molecular weight (/10,000) | MFR (g/10 min) | 1,2- or 3,4-bond content (mol %) | Order-disorder transition temperature (= T ODT) (° C.) |
|---|---|---|---|---|---|---|---|---|---|
| SEBS 1 | A-B-A-B | butadiene | 4.37 | 99.8 | 19.7 | 11.5 | 1.3 | 41.8 (1,2) | 230° C. < T ODT ≦ 260° C. |
| SEBS 2 | A-B-A-B | butadiene | 8.37 | 99.7 | 18.8 | 11.9 | 1.0 | 41.1 (1,2) | 230° C. < T ODT ≦ 260° C. |
| SEBS 3 | B-A-B-A-B | butadiene | 4.67 | 99.8 | 19.4 | 11.5 | 1.4 | 41.7 (1,2) | 230° C. < T ODT ≦ 260° C. |
| SEBS 4 | A-B-A-B | butadiene | 4.37 | 99.8 | 19.7 | 10.2 | 5.3 | 42.5 (1,2) | 190° C. < T ODT ≦ 195° C. |
| SEBS 5 | A-B-A-B | butadiene | 13.1 | 99.7 | 17.9 | 13.0 | 0.6 | 42.1 (1,2) | 230° C. < T ODT ≦ 260° C. |
| SEBS 6 | A-B-A-B | butadiene | 13.1 | 99.7 | 17.8 | 10.6 | 0.9 | 39.0 (1,2) | 230° C. < T ODT ≦ 260° C. |
| SEBS 7 | A-B-A-B | butadiene | 4.37 | 99.7 | 39.0 | 20.6 | 0.0 | 41.8 (1,2) | not melted |
| SEBS 8 | A-B-A | butadiene | 0 | 99.7 | 20.6 | 11.1 | 0.5 | 41.8 (1,2) | 300° C. < T ODT |
| SEBS 9 | A-B-A | butadiene | 0 | 99.8 | 20.9 | 9.80 | 3.8 | 37.8 (1,2) | 240° C. < T ODT ≦ 245° C. |

TABLE 3

| | Hydrogenated block copolymer | MFR (g/10 min) | Peak temperature in loss modulus curve (° C.) | | Moldability, Moldability into film | | Moldability, Appearance of molded article |
|---|---|---|---|---|---|---|---|
| | | | lower-temp. side | higher-temp. side | Molding temperature 260° C. | 23° C. | |
| Ex. 1 | SEBS1 | 1.3 | 85.6 | 114 | ○ | x | not evaluated |
| Ex. 2 | SEBS2 | 1.0 | 84.5 | 115 | ○ | x | not evaluated |
| Ex. 3 | SEBS3 | 1.4 | 85.5 | 114 | ○ | x | not evaluated |
| Ex. 4 | SEB54 | 5.3 | 82.0 | 109 | ○ | ○ | ○ |
| Comp. Ex. 1 | SEBS5 | 0.6 | 88.4 | 114 | ○ | x | not evaluated |
| Comp. Ex. 2 | SEBS6 | 0.9 | 83.0 | 108 | ○ | x | not evaluated |
| Comp. Ex. 3 | SEBS7 | 0.0 | not melted | not melted | not moldable | not moldable | not evaluated |
| Comp. Ex. 4 | SEBS8 | 0.5 | 87.4 | 116 | x | x | not evaluated |
| Comp. Ex. 5 | SEBS9 | 3.8 | 82.0 | 108 | x | x | x |

Table 3 clearly shows that the hydrogenated block copolymers according to the present invention and the compositions thereof were excellent in heat resistance, flowability, and moldability.

The following Examples 5 to 10 and comparative Examples 6 to 12 are directed to resin compositions comprising a hydrogenated block copolymer and a polyolefin resin.

Methods used for property measurements are as follows.
MFR: in accordance with JIS K7210, conditions L.
Izod impact strength: in accordance with JIS K7110; notched.
Brittleness temperature: in accordance with JIS K7216.
Flexural modulus: in accordance with JIS K7203; bending rate, 2 mm/min.
Surface hardness: in accordance with JIS K7202, hardness R.
Tensile test: in accordance with JIS K6758; pulling rate, 20 mm/min.
(I) Ingredients
(1) Polyolefin Resins
Propylene block copolymers PP1 (MK755H, manufactured by Japan Polyolefin Co., Ltd., Japan; MFR, 63 g/10 min), PP2 (MK711H, manufactured by Japan Polyolefin Co., Ltd.; MFR, 43 g/10 min), and PP3 (MK711, manufactured by Japan Polyolefin Co., Ltd.; MFR, 33 g/10 min) were used.
(2) Hydrogenated Block Copolymers
Styrene and butadiene were subjected to anionic block copolymerization in cyclohexane solvent using n-butyllithium as an initiator and tetrahydrofuran as a 1,2-bond content regulator to thereby obtain a styrene/butadiene block copolymer. The styrene/butadiene block copolymer obtained was hydrogenated at a hydrogen pressure of 5 kg/cm$^2$ and a temperature of 50° C. using bis(η$^5$-cyclopentadienyl)titanium di(chloride) and n-butyllithium as a hydrogenation catalyst. The polymer structure was controlled by changing the feed amounts of the monomers and the sequence of monomer addition. The molecular weight, 1,2-bond content, and degree of hydrogenation of the block copolymer were controlled by changing the catalyst amount, the amount of the 1,2-bond content regulator, and the period of hydrogenation, respectively. The styrene content of the block copolymer was determined with an ultraviolet spectrometer (UV), and the 1,2-bond content and degree of hydrogenation thereof were determined with a nuclear magnetic resonance spectrometer (NMR). The order-disorder transition temperature (T ODT) thereof was determined in the following manner. Using mechanical spectrometer RMS800, manufactured by Rheometrics Inc., G' and G" were measured at different temperatures under the conditions of 25-mm parallel plate and frequencies of from 0.1 rad/sec to 100 rad/sec. The temperature at which the gradient of the straight line obtained by plotting G' against G" came to change was taken as the order-disorder transition temperature.

(NMR). The order-disorder transition temperature (T ODT) thereof was determined in the following manner. Using mechanical spectrometer RMS800, manufactured by Rheometrics Inc., G' and G" were measured at different temperatures under the conditions of 25-mm parallel plate and frequencies of from 0.1 rad/sec to 100 rad/sec. The temperature at which the gradient of the straight line obtained by plotting G' against G" came to change was taken as the order-disorder transition temperature.

The structure and results of analyses of each sample are shown in Table 2.

TABLE 2

| | Structure | Kind of conjugated diene (component B) | Content of one terminal polymer block B (wt %) | Degree of hydrogenation (%) | Styrene content (wt %) | Average molecular weight (/10,000) | MFR (g/10 min) | 1,2- or 3,4-bond content (mol %) | Order-disorder transition temperature (= T ODT) (° C.) |
|---|---|---|---|---|---|---|---|---|---|
| SEBS10 | A-B-A-B | butadiene | 4.8 | 99.8 | 17.5 | 11.8 | 6.0 | 51.8 (1,2) | T ODT ≦ 230° C. |
| SEBS11 | A-B-A-B | butadiene | 4.8 | 99.8 | 31.0 | 7.6 | 4.5 | 40.5 (1,2) | 260° C. < T ODT |
| SEBS12 | A-B-A-B | butadiene | 4.8 | 99.7 | 9.8 | 15.5 | 9.8 | 42.1 (i,2) | T ODT ≦ 230° C. |
| SEBS13 | A-B-A-B | butadiene | 4.8 | 99.7 | 23.1 | 9.3 | 6.5 | 46.0 (i,2) | T ODT ≦ 230° C. |
| SEBS14 | A-B-A-B | butadiene | 4.8 | 99.7 | 16.8 | 12.6 | 7.7 | 61.0 (i,2) | T ODT ≦ 230° C. |
| SEBS15 | A-B-A-B | butadiene | 4.8 | 99.7 | 17.4 | 11.0 | 7.0 | 34.5 (1,2) | T ODT ≦ 23° C. |
| SEBS16 | A-B-A | butadiene | 0 | 99.7 | 19.1 | 10.6 | 4.0 | 44.8 (1,2) | 260° C. < T ODT |
| SEBS17 | A-B-A-B | butadiene | 17.5 | 99.7 | 21.5 | 9.5 | 3.9 | 40.2 (1,2) | 230° C. < T ODT ≦ 260° C. |
| SEPS 1 | A-B-A-B | isoprene | 4.8 | 99.7 | 16.5 | 11.0 | 6.0 | 5.0 (3,4) | T ODT ≦ 230° C. |
| SEPS 2 | A-B-A-B | isoprene | 17.5 | 99.7 | 22.5 | 9.5 | 3.8 | 5.0 (3,4) | 230° C. < T ODT ≦ 260° C. |

On the other hand, styrene and isoprene were subjected to living anionic block copolymerization in cyclohexane solvent using sec-butyllithium as an initiator to thereby obtain a styrene/isoprene block copolymer. The styrene/isoprene block copolymer obtained was hydrogenated at a hydrogen pressure of 50 kg/cm$^2$ and a temperature of 50° C. using nickel naphthenate and triethylaluminum as a hydrogenation catalyst. The polymer structure was controlled by changing the feed amounts of the monomers and the sequence of monomer addition. The molecular weight and degree of hydrogenation of the block copolymer were controlled by changing the catalyst amount and the period of hydrogenation, respectively. The styrene content of the block copolymer was determined with an ultraviolet spectrometer (UV), and the degree of hydrogenation thereof was determined with a nuclear magnetic resonance spectrometer (4) Talc Micro Ace P-4, a commercial talc manufactured by Nippon Talc Co., Ltd., Japan, was used.

(II) Preparation of Resin Compositions and Property Examination thereof

Ingredients (1), (2), and (4) were dry-blended according to each of the formulations shown in Tables 4 and 5. Each mixture obtained was melt-kneaded with a co-rotating twin-screw extruder (screw diameter, 30 mm) set at 230° C., and then pelletized. The pellets were injection-molded with an injection molding machine set at 230° C. to produce test pieces for property examinations. The test pieces obtained were examined for properties, and the results obtained are shown in Tables 4 and 5. As apparent from Tables 4 and 5, the resin compositions according to the present invention had excellent properties.

TABLE 4

| | | | Ex. 5 | Ex. 6 | Comp. Ex. 6 | Comp. Ex. 7 | Comp. Ex. 8 |
|---|---|---|---|---|---|---|---|
| Formulation | (1) | Polyolefin resin | PP1 34 wt % PP2 | PP1 34 wt % PP2 | PP1 34 wt % PP2 | PP1 34 wt % PP2 | PP1 40 wt % PP2 |

TABLE 4-continued

|  |  | Ex. 5 | Ex. 6 | Comp. Ex. 6 | Comp. Ex. 7 | Comp. Ex. 8 |
|---|---|---|---|---|---|---|
|  |  | 51 wt % | 51 wt % | 51 wt % | 51 wt % | 60 wt % |
|  | MFR (g/10 min) (2) | 50.3 | 50.3 | 50.3 | 50.3 | 50.3 |
|  | Hydrogenated block copolymer (4) | SEBS 10 15 wt % | SEPS 1 15 wt % | SEBS 11 15 wt % | SEBS 12 15 wt % | 0 wt % |
|  | Talc [(1) + (2) = 100 pts. wt.] | 25 pts. wt. | 25 pts. wt. | 25 pts. wt. | 25 pts. wt. | 0 pt. wt. |
| Property | Izod impact strength, 23° C. (J/m) | 210 | 200 | 102 | 172 | 19 |
|  | Flexural modulus (MPa) | 2320 | 2320 | 2390 | 2190 | 1650 |
|  | Brittleness temperature (° C.) | −21.8 | −19.1 | −10.8 | −19.0 | 8.2 |
|  | Rockwell hardness (scale R) | 71 | 70 | 72 | 65 | 87 |
|  | Tensile elongation at break (%) | 75 | 52 | 26 | 38 | 18 |

TABLE 5

|  |  | Ex. 7 | Ex. 8 | Ex. 9 | Ex. 10 | Comp. Ex. 9 | Comp. Ex. 10 | Comp. Ex. 11 | Comp. Ex. 12 |
|---|---|---|---|---|---|---|---|---|---|
| Formulation | (1) Polyolefin resin | PP3 81 wt % | PP3 81 wt % | PP3 81 wt % | PP3 81 wt % | PP3 81 wt % | PP3 81 wt % | PP3 81 wt % | PP3 100 wt % |
|  | MFR (g/10 min) (2) | 33.0 | 33.0 | 33.0 | 33.0 | 33.0 | 33.0 | 33.0 | 33.0 |
|  | Hydrogenated block copolymer (4) | SEBS 10 19 wt % | SEBS 13 19 wt % | SEBS 14 19 wt % | SEBS 15 19 wt % | SEBS 16 19 wt % | SEBS 17 19 wt % | SEPS 2 19 wt % | 0 wt % |
|  | Talc [(1) + (2) = 100 pts. wt.) | 25 pts. wt. | 25 pts. wt. | 25 pts. wt. | 25 pts. wt. | 25 pts. wt. | 25 pts. wt. | 25 pts. wt. | 0 pt.wt. |
| Property | Izod impact strength 23° C. (J/m) | 669 | 655 | 651 | 651 | 650 | 590 | 550 | 36 |
|  | Flexural modulus (MPa) | 1800 | 1800 | 1790 | 1800 | 1770 | 1750 | 1750 | 1430 |
|  | Brittleness temperature (° C.) | −31.2 | −30.5 | −26.1 | −28.0 | −26.0 | −22.0 | −21.5 | 3.8 |
|  | Rockwell hardness (scale R) | 61 | 62 | 60 | 60 | 60 | 60 | 60 | 93 |
|  | Tensile elongation at break (%) | 495 | 440 | 440 | 310 | 120 | 210 | 17a | 228 |

The resin compositions and molded articles according to the present invention have an excellent balance among impact resistance, brittleness temperature, rigidity, surface hardness and tensile elongation at break. Due to this effect, the compositions of the present invention are suitable for use as automotive interior materials such as, e.g., instrument panels and air bag covers and automotive exterior materials such as, e.g., bumpers, and in other applications including tubes, various containers and sheets.

While the invention has been described in detail and with reference to specific examples thereof, it will be apparent to one skilled in the art that various changes and modifications can be made therein without departing from the spirit and scope thereof.

What is claimed is:

1. A hydrogenated block copolymer comprising:
   two polymer blocks A mainly comprising vinylaromatic hydrocarbon compound monomer units; and
   two polymer blocks B mainly comprising hydrogenated conjugated diene compound monomer units, in which at least 90% of the olefinically unsaturated double bonds contained in the unhydrogenated polymer block mainly comprising the conjugated diene compound monomer units is hydrogenated, wherein the hydrogenated block copolymer has a block arrangement of A-B-A-B, wherein the proportion of said terminal polymer block B in the hydrogenated block copolymer being 0.1% by weight or higher and lower than 9.1% by weight, wherein the content of said vinylaromatic hydrocarbon compound units in the hydrogenated block copolymer is 12% by weight or higher and lower than 25% by weight, wherein said conjugated diene compound monomer is butadiene, and the unhydrogenated polymer blocks mainly comprising butadiene monomer units have a 1,2-bond content higher than 50 mol % and lower than 90 mol %, and wherein the hydrogenated block copolymer has an order-disorder transition temperature of 260° C. or lower.

2. The hydrogenated block copolymer of claim 1, wherein the content of said vinylaromatic hydrocarbon compound units in the hydrogenated block copolymer is 14% by weight or higher and lower than 25% by weight.

3. The hydrogenated block copolymer of claim 1, wherein said conjugated diene compound monomer is butadiene, and the unhydrogenated polymer blocks mainly comprising butadiene monomer units have a 1,2-bond content higher than 40 mol % and lower than 60 mol %. having a block arrangement of B-A-B-A-B.

4. The hydrogenated block copolymer of claim 1, having a segment comprising a random or tapered copolymer of a conjugated diene compound monomer and a vinylaromatic hydrocarbon compound monomer as a connecting part between neighboring polymer blocks A and B.

5. The hydrogenated block copolymer of claim 1, having a melt flow rate (MFR) not lower than 1.0 g/10 min and lower than 15 g/10 min as determined in accordance with JIS K7210 under the conditions of a temperature of 230° C. and a load of 2.16 kg.

6. A resin composition comprising (1) from 1 to 99% by weight of a polyolefin resin and (2) from 1 to 99% by weight of the hydrogenated block copolymer of claim 1.

7. A resin composition comprising (1) from 60 to 99% by weight of a polyolefin resin and (2) from 1 to 40% by weight of the hydrogenated block copolymer of claim 1.

8. The resin composition of claim 7, further comprising (3) from 1 to 30 parts by weight of an olefin elastomer per 100 parts by weight of said resin composition.

9. The resin composition of claim 8, further comprising (4) from 5 to 50 parts by weight of an inorganic filler per 100 parts by weight of said resin composition.

10. The resin composition of claim 7, further comprising (4) from 5 to 50 parts by weight of an inorganic filler per 100 parts by weight of said resin composition.

* * * * *